US012622065B2

(12) United States Patent
Chen

(10) Patent No.: US 12,622,065 B2
(45) Date of Patent: May 5, 2026

(54) ELECTROSTATIC DISCHARGE PROTECTION DEVICE

(71) Applicant: VIA TECHNOLOGIES, INC., New Taipei City (TW)

(72) Inventor: Ke-Yuan Chen, New Taipei City (TW)

(73) Assignee: VIA TECHNOLOGIES, INC., New Taipei City (TW)

( * ) Notice: Subject to any disclaimer, the term of this patent is extended or adjusted under 35 U.S.C. 154(b) by 467 days.

(21) Appl. No.: 18/296,531

(22) Filed: Apr. 6, 2023

(65) Prior Publication Data

US 2024/0222361 A1      Jul. 4, 2024

(30) Foreign Application Priority Data

Jan. 4, 2023    (TW) .................................. 112100211

(51) Int. Cl.
H10D 89/60            (2025.01)

(52) U.S. Cl.
CPC .................................. H10D 89/713 (2025.01)

(58) Field of Classification Search
CPC .......... H10D 89/713; H10D 89/60–931; H01L 23/60
See application file for complete search history.

(56) References Cited

U.S. PATENT DOCUMENTS

| | | | | |
|---|---|---|---|---|
| 2013/0277745 A1* | 10/2013 | Tsai | ...................... | H10D 89/815 |
| | | | | 257/355 |
| 2020/0083212 A1* | 3/2020 | Zhao | ..................... | H10D 62/142 |
| 2022/0130819 A1* | 4/2022 | Chen | ..................... | H10D 84/811 |
| 2023/0307440 A1* | 9/2023 | Stockinger | ............. | H02H 9/046 |
| 2024/0222362 A1* | 7/2024 | Do | ........................ | H10D 89/921 |

FOREIGN PATENT DOCUMENTS

| | | | | |
|---|---|---|---|---|
| CN | 110211956 B | * | 11/2022 | ........... H10D 89/713 |

* cited by examiner

*Primary Examiner* — Fernando L Toledo
*Assistant Examiner* — Marshall Mu-Nuo Hatfield
(74) *Attorney, Agent, or Firm* — McClure, Qualey & Rodack, LLP

(57)            ABSTRACT

An electrostatic discharge protection device is provided. The electrostatic discharge protection device includes first and second N-type deep well (DNW) regions in a P-type semi-conductor substrate, first to fourth N-type and P-type doped regions, and first and second P-type well (PW) regions. The first N-type and P-type doped regions and the first PW region are located in the first DNW region. The second N-type and P-type doped regions and the second PW region are located in the second DNW region. The third and fourth N-type and P-type doped regions are located in the first and second PW regions. The first P-type and fourth N-type doped regions are connected to an input/output terminal. The first N-type and second P-type doped regions are connected to a power supply terminal. The third N-type and the fourth P-type doped regions are connected to a ground terminal.

18 Claims, 10 Drawing Sheets

ELECTROSTATIC DISCHARGE PROTECTION DEVICE

CROSS REFERENCE TO RELATED APPLICATIONS

This application claims priority of Taiwan Patent Application No. 112100211, filed on Jan. 4, 2023, the entirety of which is incorporated by reference herein.

BACKGROUND OF THE INVENTION

Field of the Invention

The present disclosure relates to an electrostatic discharge protection device, and, in particular, to the structure and layout of the electrostatic discharge protection device.

Description of the Related Art

Integrated circuits (ICs) include semiconductor devices that are susceptible to damage from electrical overstress conditions (EOS) which includes electrostatic discharge (ESD), transient conditions, latch-up, and incorrect polarity connections. The electrical overstress conditions are characterized by over-voltage and over-current stress events. Electrostatic charge (ESC) would accumulate in IC package, manufacturing machine or operator and it would damage semiconductor devices and circuitry therein if the IC is stressed by the charge. This phenomenon is called electrostatic discharge. Therefore, how to protect semiconductor devices from ESD or other electrical overvoltage conditions is a problem that needs to be solved. In addition, for high-speed and high-end chips, a conventional ESD protection circuit using diodes or transistors cannot solve the ESD problem.

BRIEF SUMMARY OF THE INVENTION

An embodiment of the disclosure provides an electrostatic discharge protection device. The electrostatic discharge protection device includes a P-type semiconductor substrate, a first N-type deep well region, a second N-type deep well region, a first N-type doped region, a first P-type doped region, a second N-type doped region, a second P-type doped region, a third N-type doped region, a third P-type doped region, a fourth N-type doped region, a fourth P-type doped region, a first P-type well region and a second P-type well region. The first N-type deep well region is located in the P-type semiconductor substrate. The first N-type doped region is located in the first N-type deep well region. The first P-type doped region is located in the first N-type deep well region. The first P-type doped region and the first N-type deep well region are arranged side-by-side and spaced from each other. The second N-type deep well region is located in the P-type semiconductor substrate. The second N-type deep well region and the first N-type deep well region are arranged side-by-side and spaced from each other. The second N-type doped region is located in the second N-type deep well region. The second P-type doped region is located in the second N-type deep well region. The second P-type doped region and the second N-type doped region are arranged side-by-side and spaced from each other. The first P-type well region is located in the first N-type deep well region. The third N-type doped region is located in the first P-type well region. The third P-type doped region is located in the first P-type well region. The third P-type doped region and the third N-type doped region are arranged side-by-side and spaced from each other. The second P-type well region is located in the second N-type deep well region. The fourth N-type doped region is located in the second P-type well region. In addition, the fourth P-type doped region is located in the second P-type well region. The fourth P-type doped region and the fourth N-type doped region are arranged side-by-side and spaced from each other. The first P-type doped region and the fourth N-type doped region are electrically connected to an input/output terminal. The first N-type doped region and the second P-type doped region are electrically connected to a power supply terminal. The third N-type doped region and the fourth P-type doped region are electrically connected to a ground terminal.

BRIEF DESCRIPTION OF THE DRAWINGS

The present invention can be more fully understood by reading the subsequent detailed description and examples with references made to the accompanying drawings, wherein.

DETAILED DESCRIPTION OF THE INVENTION

The following description is made for the purpose of illustrating the general principles of the invention and should not be taken in a limiting sense. The scope of the invention is best determined by reference to the appended claims.

Figure 1:
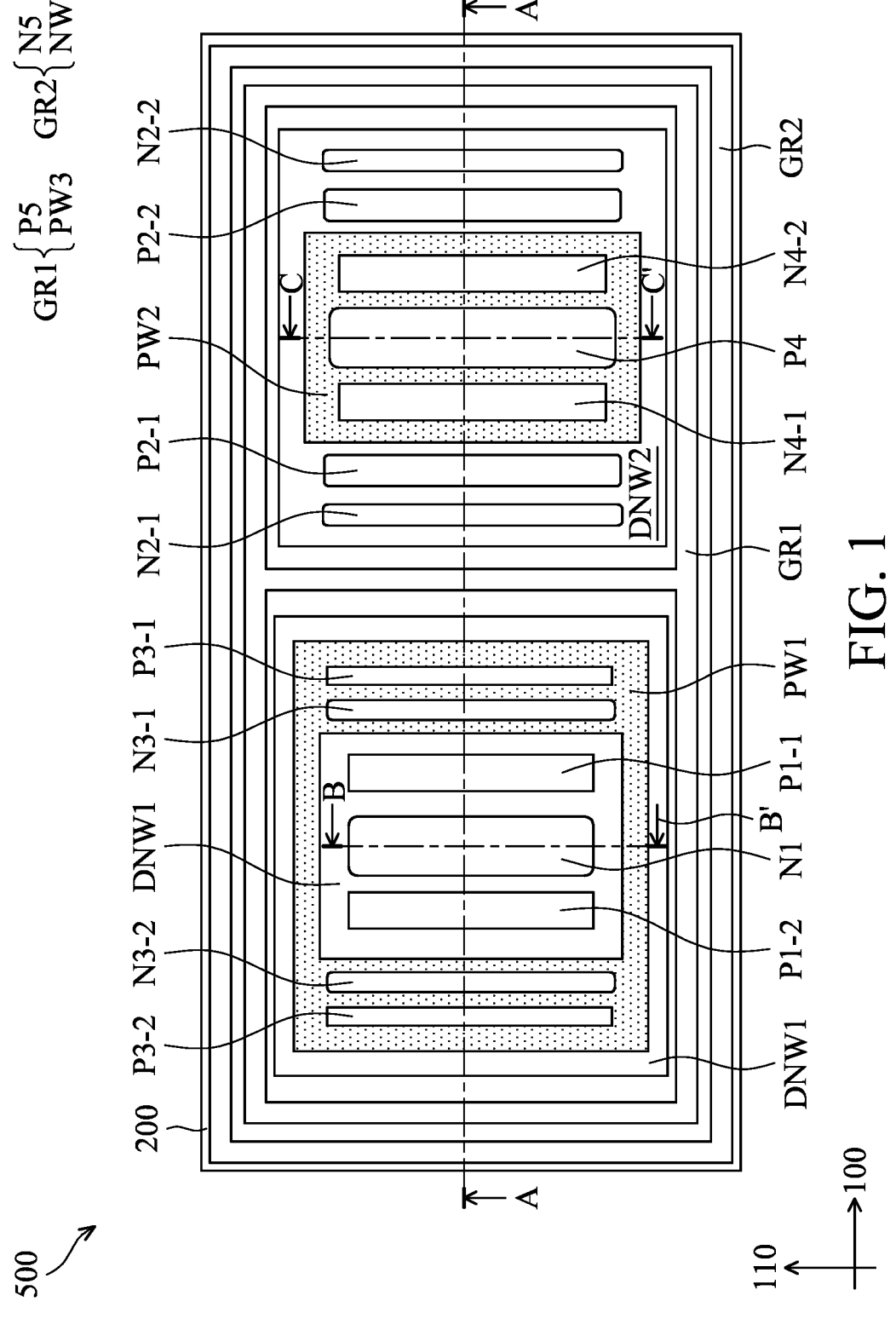
FIG. 1 is a schematic top view of an electrostatic discharge protection device in accordance with some embodiments of the disclosure.

FIG. 1 is a schematic top view of an electrostatic discharge (ESD) protection device 500 (including ESD protection devices 500A, 500B, 500C, 500D, 500E, and 500F) in accordance with some embodiments of the disclosure. FIG.

2 is a schematic cross-sectional view along the line A-A' of the ESD protection device 500A of FIG. 1 in accordance with some embodiments of the disclosure. The ESD protection device 500 is electrically connected between the input/output terminal (IO) and the ground terminal (VSS) of the system to prevent an electrostatic discharge current from flowing through the circuit under protection. The ESD protection device 500A includes a P-type semiconductor substrate 200, and a first guard ring GR1, a second guard ring GR2, a first N-type deep well region DNW1, a second N-type deep well region DNW2, a P-type well region PW1 and a second P-type well region PW2 located in the P-type semiconductor substrate 200. The first N-type deep well region DNW1, the second N-type deep well region DNW2, the first P-type well region PW1 and the second P-type well region PW2 respectively include at least one pair of heavily doped regions of opposite conductivity types. FIG. 1 only shows the above components for illustration, and other features may be shown in the cross-sectional schematic view of FIG. 2, which is taken along the line A-A' of FIG. 1, and the line A-A' is substantially parallel to a direction 100. For example, the first N-type deep well region DNW1 includes a first N-type doped region N1 and a first P-type doped region P1 (including first P-type doped regions P1-1 and P1-2). The second N-type deep well region DNW2 includes a second N-type doped region N2 (including second N-type doped region N2-1 and N2-2) and a second P-type doped region P2 (including second P-type doped region P2-1 and P2-2). The first P-type well region PW1 includes a third N-type doped region N3 (including the third N-type doped region N3-1 and N3-2) and a third P-type doped region P3 (including third P-type doped region P3-1 and P3-2). The second P-type well region PW2 includes a fourth N-type doped region N4 (including fourth N-type doped region N4-1 and N4-2) and a fourth P-type doped region P4.

Figure 2:
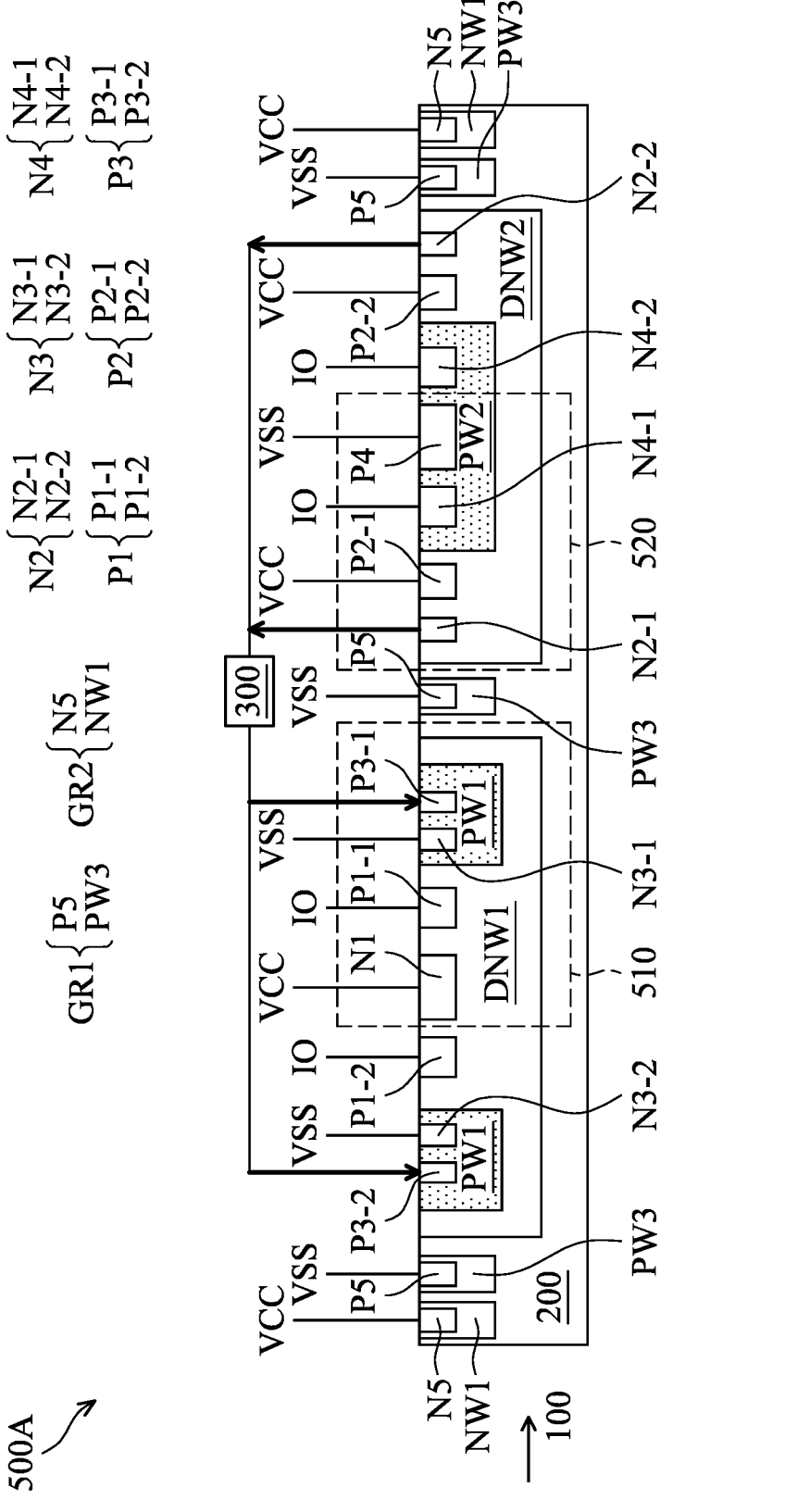
FIG. 2 is a schematic cross-sectional view along the line A-A' of the electrostatic discharge protection device of FIG. 1 in accordance with some embodiments of the disclosure.

As shown in FIGS. 1 and 2, both the first N-type deep well region DNW1 and the second N-type deep well region DNW2 are located in the P-type semiconductor substrate 200. In addition, both the first N-type deep well region DNW1 and the second N-type deep well region DNW2 are arranged side-by-side along the direction 100 and spaced apart from each other. The ESD protection device 500A further includes the first N-type doped region N1 and the first P-type doped regions P1-1 and P1-2 located in the first N-type deep well region DNW1. The first N-type doped region N1 and the first P-type doped regions P1-1 and P1-2 extend along the direction 110 and are disposed in the central region of the first N-type deep well region DNW1. Moreover, the first P-type doped regions P1-1 and P1-2 are respectively located on opposite sides of the first N-type doped region N1 substantially parallel to a direction 110, and are respectively disposed spaced apart from the first N-type doped region N1 along the direction 100. In this embodiment, the first N-type doped region N1 is electrically connected to a power supply terminal VCC. In addition, the first P-type doped regions P1-1 and P1-2 are electrically connected to an input/output terminal IO.

As shown in FIGS. 1 and 2, the ESD protection device 500A further includes the second N-type doped regions N2-1 and N2-2 and the second P-type doped regions P2-1 and P2-2 located in the second N-type deep well region DNW2. The second N-type doped regions N2-1 and N2-2 and the second P-type doped regions P2-1 and P2-2 extend along the direction 110. Moreover, the second N-type doped region N2-1 and the second P-type doped region P2-1 are located in a peripheral region of the second N-type deep well region DNW2 close to the first N-type deep well region DNW1, and both are arranged side-by-side and spaced apart from each other along the direction 100. The second N-type doped region N2-2 and the second P-type doped region P2-2 are located in the peripheral region of the second N-type deep well region DNW2 away from the first N-type deep well region DNW1, and both are arranged side-by-side and spaced apart from each other along the direction 100. In this embodiment, the second N-type doped regions N2-1 and N2-2 are electrically connected to an output terminal of a switching circuit 300 (the structure of the switching circuit 300 can be referred to FIG. 4A). In addition, the second P-type doped regions P2-1 and P2-2 are electrically connected to the power supply terminal VCC.

As shown in FIGS. 1 and 2, the first P-type well region PW1 of the ESD protection device 500A is located in the first N-type deep well region DNW1. In the top view as shown in FIG. 1, the first P-type well region PW1 is ring-shaped and covers the peripheral region of the first N-type deep well region DNW1. In the cross-sectional view as shown in FIG. 2, the first P-type well region PW1 is located on opposite sides of the first N-type doped region N1 along the direction 110. The ESD protection device 500A further includes the third N-type doped regions N3-1 and N3-2 and the third P-type doped regions P3-1 and P3-2 located in the first P-type well region PW1. The third N-type doped regions N3-1 and N3-2 and the third P-type doped regions P3-1 and P3-2 extend along the direction 110. Moreover, the third N-type doped region N3-1 and the third P-type doped region P3-1 are located in a peripheral region of the first N-type deep well region DNW1 close to the second N-type deep well region DNW2, and both are arranged side-by-side and spaced apart from each other along the direction 100. The third N-type doped region N3-2 and the third P-type doped region P3-2 are located in the peripheral region of the first N-type deep well region DNW1 away from the second N-type deep well region DNW2, and both are arranged side-by-side and spaced apart from each other along the direction 100. In this embodiment, the third N-type doped regions N3-1 and N3-2 are electrically connected to a ground terminal VSS. In addition, the third P-type doped regions P3-1 and P3-2 are electrically connected to another output terminal (relative to the second N-type doped regions N2-1 and N2-2) of the switching circuit 300.

As shown in FIGS. 1 and 2, the second P-type well region PW2 of the ESD protection device 500A is located in the second N-type deep well region DNW2, and is disposed on the central region of the second N-type deep well region DNW2. Therefore, the second N-type deep well region DNW2 not covered by the second P-type well region PW2 is ring-shaped in the top view of FIG. 1. The ESD protection device 500A further includes the fourth N-type doped regions N4-1 and N4-2 and the fourth P-type doped region P4 located in the second P-type well region PW2. The fourth N-type doped regions N4-1 and N4-2 and the fourth P-type doped region P4 extend along the direction 110. Moreover, the fourth N-type doped regions N4-1 and N4-2 are respectively located on opposite sides of the fourth P-type doped region P4 substantially parallel to the direction 110, and are respectively spaced apart the fourth P-type doped region P4 along the direction 100. In this embodiment, the fourth N-type doped regions N4-1 and N4-2 are electrically connected to the input/output terminal IO. In addition, the fourth P-type doped region P4 is electrically connected to the ground terminal VSS.

As shown in FIGS. 1 and 2, the first guard ring GR1 of the ESD protection device 500A is located outside the first N-type deep well region DNW1 and the second N-type deep well region DNW2, and surrounds the first N-type deep well region DNW1 and the second N-type deep well region DNW1. In addition, the first guard ring GR1 is located between the first P-type well region PW1 and the second P-type well region PW2 along the direction 100. The first guard ring GR1 includes a third P-type well region PW3 and a fifth P-type doped region P5 located in the third P-type well region PW3. In this embodiment, the P-type semiconductor substrate 200 can be electrically connected to the ground terminal VSS through the fifth P-type doped region P5.

As shown in FIGS. 1 and 2, the second guard ring GR2 of the ESD protection device 500A is located outside the first N-type deep well region DNW1 and the second N-type deep well region DNW2, and surrounds the first guard ring GR1. The second guard ring GR2 includes a first N-type well region NW1 and a fifth N-type doped region N5 located in the first N-type well region NW1. In some embodiments, the fifth N-type doped region N5 is electrically connected to the power supply terminal VCC. Generally, the N-type guard ring (the second guard ring GR2) is electrically connected to a higher voltage level, and the P-type guard ring (the first guard ring GR1) is electrically connected to a lower voltage level.

As shown in FIGS. 1 and 2, the first P-type well region PW1 and the heavily doped regions (including the first N-type doped region N1 and the first P-type doped regions P1-1 and P1-2) disposed in the first N-type deep well region DNW1), and the heavily doped regions (including the third N-type doped region N3-1 and N3-2 and the third P-type doped region P3-1 and P3-2) disposed in the first P-type well region PW1 are arranged symmetrically along the axis passing through the center of the first N-type doped region N1 along the direction 110 (illustrated as a dotted line B-B'). Similarly, the second P-type well region PW2 and the heavily doped regions (including the second N-type doped regions N2-1 and N2-2 and the second P-type doped regions P2-1 and P2-2) disposed in the second N-type deep well region DNW2, and the heavily doped regions disposed in the second P-type well region PW2 (including the fourth N-type doped regions N4-1 and N4-2 and the fourth P-type doped region P4) are arranged symmetrically along the axis passing through the center of the fourth P-type doped region P4 along the direction 110 (illustrated as a dotted line C-C'). Therefore, the following figures will be taken from the regions 510 and 520 in FIG. 2 to illustrate the equivalent circuit diagram triggered by each electrostatic discharge event occurring at the input/output terminal IO, the power supply terminal VCC or the ground terminal VSS and illustrate the ESD protection devices in other embodiments. In addition, the second, third and fourth N-type doped regions in the following figures are respectively labeled as the second doped region N2, the third N-type doped region N3 and the fourth N-type doped region N4. In addition, the first, second and third P-type doped regions are respectively labeled as the first P-type doped region P1, the second P-type doped region P2 and the third P-type doped region P3.

In some embodiments described below, the voltage levels of the second N-type doped region N2 and the third P-type doped region P3 may be switched to different levels by the switching circuit 300 according to different situations. For example, when the protected circuit is in normal operation (no electrostatic discharge event occurs), the second N-type doped region N2 electrically connected to the switching circuit 300 will be electrically connected to (switched to) the power supply terminal VCC (the voltage level of which is equal to the high level), and the third P-type doped region P3 electrically connected to the switching circuit 300 will be electrically connected to (switched to) the ground terminal VSS (the voltage level of which is equal to the ground level). When an electrostatic discharge event occurs at the input/output terminal IO, the power supply terminal VCC or the ground terminal VSS, the second N-type doped region N2 electrically connected to the switching circuit 300 will be electrically connected to the ground terminal VSS (the voltage level of which is equal to the ground level), and the third P-type doped region P3 electrically connected to the switching circuit 300 will be electrically connected to the power supply terminal VCC (the voltage level of which is equal to the high level).

Figure 3:
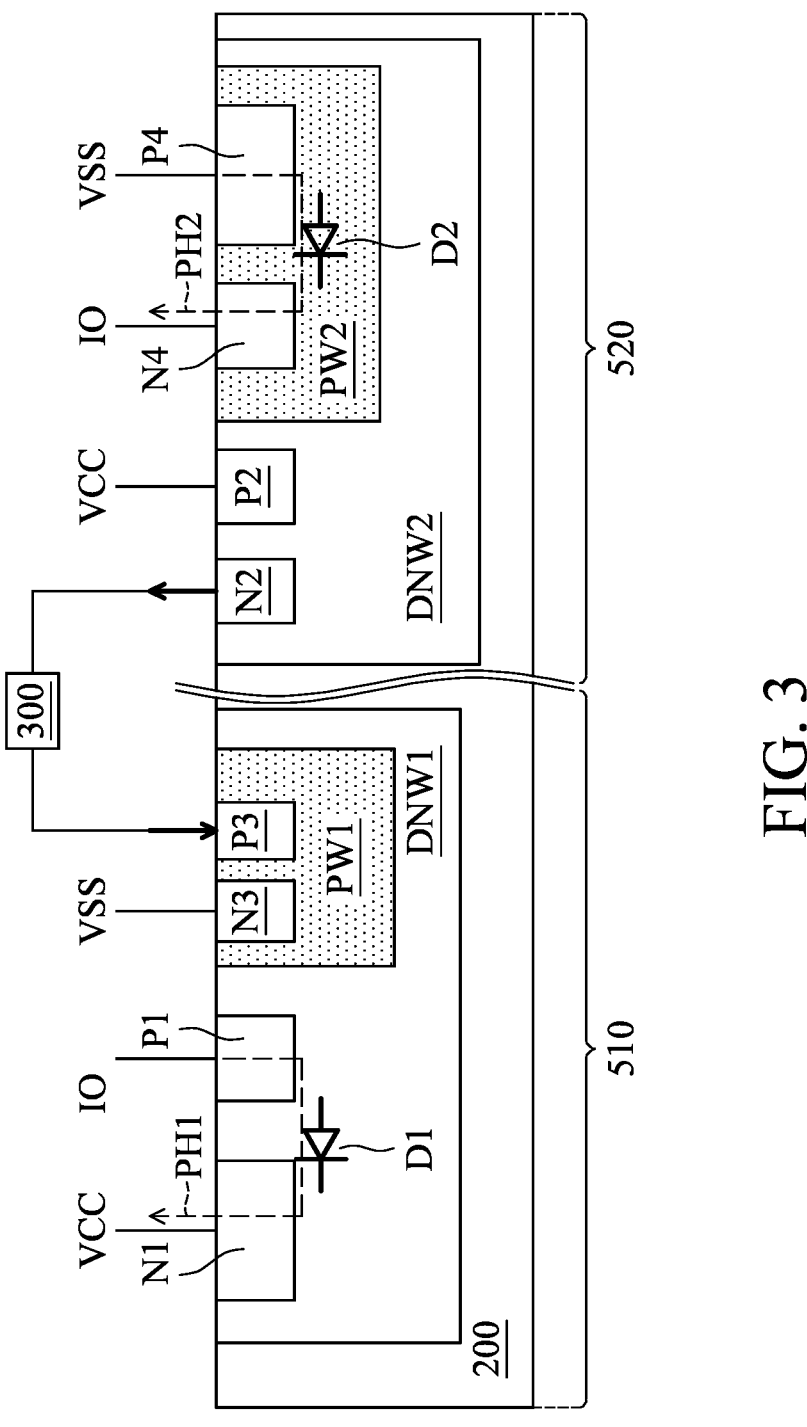
FIG. 3 is a partial enlarged view of FIG. 2 showing an equivalent discharge circuit diagram of the electrostatic discharge protection device when an electrostatic discharge event occurs between the input/output terminal (IO) and the power supply terminal (VCC) or between a ground terminal (VSS) and the input/output terminal (IO), and schematic showing the parasitic elements of the equivalent discharge circuit at the corresponding positions of the electrostatic discharge protection device of FIG. 2.
Figure 3:

FIG. 3 is an enlarged view of the areas 510, 520 of FIG. 2, which shows an equivalent discharge circuit diagram of the ESD protection device when an electrostatic discharge (ESD) event occurs between the input/output terminal IO and the power supply terminal VCC or between the ground terminal VSS and the input/output terminal IO. FIG. 3 is also a schematic cross-sectional view showing the parasitic elements of the equivalent discharge circuit at the corresponding positions of the ESD protection device 500A of FIG. 2. As shown in FIG. 3, the first P-type doped region P1, the first N-type deep well region DNW1 and the first N-type doped region N1 form a first parasitic diode D1. When an electrostatic discharge event occurs between the input/output terminal IO and the power supply terminal VCC, the first parasitic diode D1 is triggered to ON (turned-on) to form a current path PH1 from the input/output terminal IO to the power supply terminal VCC to discharge the electrostatic charges away from the circuits under protection.

As shown in FIG. 3, the fourth P-type doped region P4, the second P-type well region PW2 and the fourth N-type doped region N4 form a second parasitic diode D2. When an electrostatic discharge event occurs between the ground terminal VSS and the input/output terminal IO, the second parasitic diode D2 is triggered to ON to form a current path PH2 from the ground terminal VSS to the input/output terminal IO to discharge the electrostatic charges away from the circuits under protection.

Figures 4A, 4B:
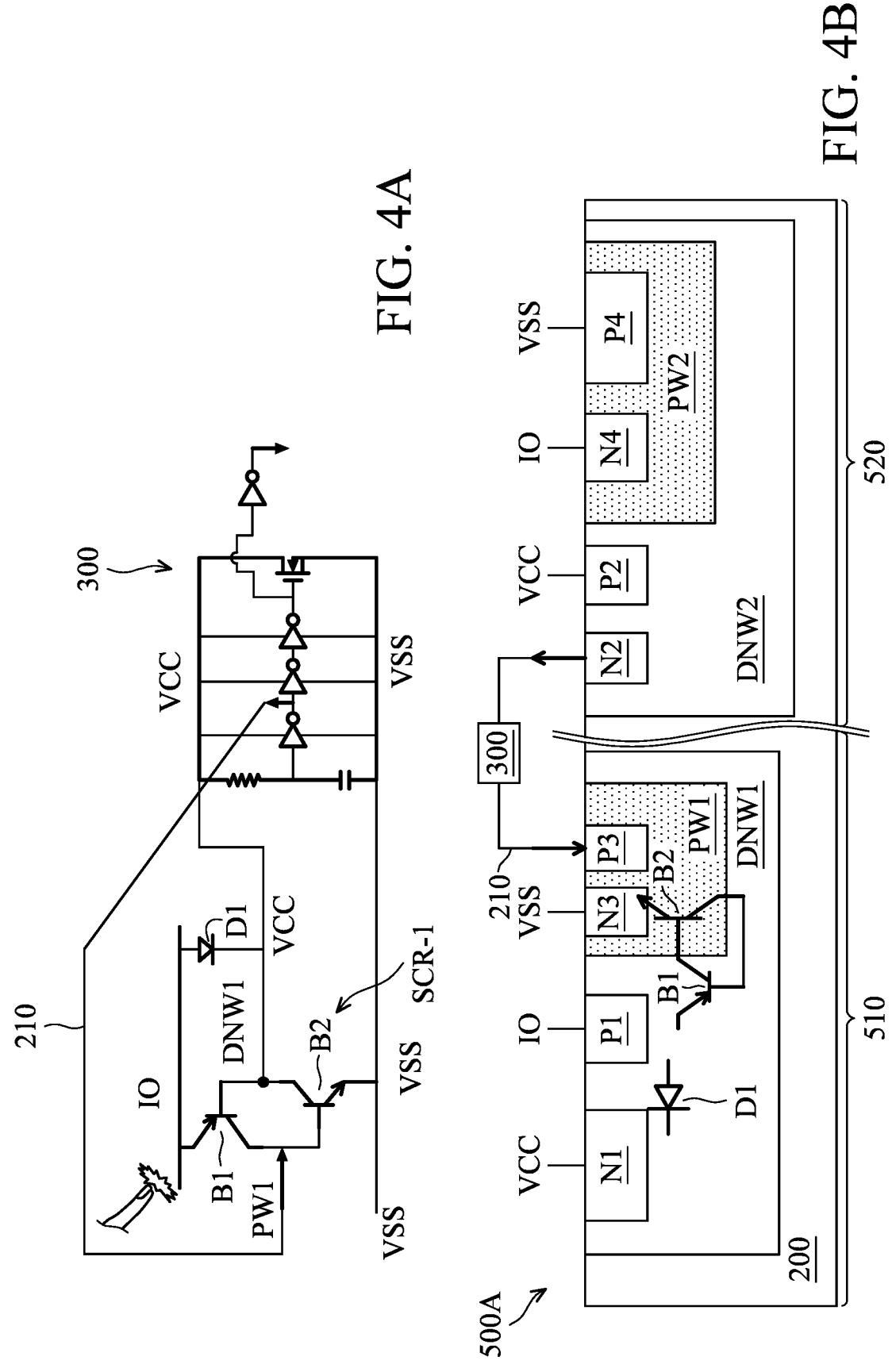
FIG. 4A is an equivalent discharge circuit diagram of the electrostatic discharge protection device when an electrostatic discharge event occurs between the input/output terminal (IO) and the ground terminal (VSS)
FIG. 4B is a schematic cross-sectional view showing the parasitic elements of the equivalent discharge circuit of FIG. 4A at the corresponding positions of the electrostatic discharge protection device of FIG. 2.

FIG. 4A shows another equivalent discharge circuit diagram of the ESD protection device 500A and the switching circuit 300 electrically connected to the equivalent discharge circuit when an electrostatic discharge (ESD) event occurs between the input/output terminal IO and the ground terminal VSS. FIG. 4B is also a schematic cross-sectional view showing the parasitic elements of the equivalent discharge circuit in FIG. 4A at the corresponding positions of the ESD protection device 500A of FIG. 2. As shown in FIGS. 4A and 4B, in addition to the first parasitic diode D1, the equivalent discharge circuit in a condition that the electrostatic discharge event occurs between the input/output terminal IO and the ground terminal VSS also includes a first parasitic bipolar junction transistor (BJT) B1 (for example, a parasitic PNP BJT) formed by a first P-type doped region P1, the first N-type deep well region DNW1 and the first P-type well region PW1. Emitter, base and collector of the first parasitic bipolar junction transistor B1 are respectively formed by the first P-type doped region P1, the first N-type deep well region DNW1 and the first P-Type well region PW1. The equivalent discharge circuit also includes a second parasitic bipolar junction transistor B2 (such as a parasitic NPN BJT) formed by the third N-type doped region N3, the first P-type well region PW1 and the first N-type deep well region DNW1. Emitter, base and collector of the second parasitic bipolar junction transistor B2 are respectively formed by the third N-type doped region N3, the first P-type well region PW1 and the first N-type deep well region DNW1. Moreover, the base of the first parasitic bipolar junction transistor B1 (the first N-type deep well region DNW1) is electrically connected to the collector (the first N-type deep well region DNW1) of the second parasitic bipolar junction transistor B2, and the base (the first P-type well region PW1) of the second parasitic bipolar junction transistor B2 is electrically connected to the collector (the first P-type well region PW1) of the first parasitic bipolar junction transistor B1 to form the first parasitic semiconductor controlled rectifier SCR-1. In addition, the emitter (the first P-type doped region P1) of the first parasitic bipolar junction transistor B1 is electrically connected to the input/output terminal IO and the anode of the first parasitic diode D1. The base (the first N-type deep well region DNW1) of the first parasitic bipolar junction transistor B1 is electrically connected to the cathode of the first parasitic diode D1. The emitter (the third N-type doped region N3) of the second parasitic bipolar junction transistor B2 is electrically connected to the ground terminal VSS.

FIG. 4A also shows an equivalent circuit diagram of the switching circuit 300. The switching circuit 300 is formed by a resistance-capacitance detector (RC detector), which includes a resister, a capacitor, an inverter and an N-type metal-oxide-semiconductor (NMOS) transistor.

As shown in FIGS. 4A and 4B, when an electrostatic discharge (ESD) event occurs between the input/output terminal IO and the ground terminal VSS, the first parasitic diode D1 and the emitter (the first P-type doped region P1)-base (the first N-type deep well region DNW1) junction of the first parasitic bipolar junction transistor B1 are forward biased and triggered to ON. A current path flowing from the input/output terminal IO, through the emitter (first P-type doped region P1)-base (first N-type deep well region DNW1) junction of the first parasitic bipolar junction transistor B1 and to the switching circuit 300 is formed, so that the first parasitic bipolar junction transistor B1 is triggered to ON, and makes the switching circuit 300 output a high level (high voltage level) to the third P-type doped region P3 (which is switched to be electrically connected to the power supply terminal VCC). The high level is higher than the ground level of the ground terminal VSS. Moreover, the switching circuit 300 is electrically connected to the base (the first P-type well region PW1) of the second parasitic bipolar junction transistor B2 through the conductive line 210. Therefore, when the high level output by the switching circuit 300 is higher than the ground level of the ground terminal VSS, a current path flowing through the conductive line 210 will be formed. The base (the first P-type well region PW1)-emitter (the third N-type doped region N3) junction of the second parasitic bipolar junction transistor B2 is forward biased, so that the second parasitic bipolar junction transistor B2 is triggered to ON. Since the first parasitic bipolar junction transistor B1 and the second parasitic bipolar junction transistor B2 are both triggered to ON, the first parasitic semiconductor controlled rectifier SCR-1 is triggered to ON and a current path is formed. The current path provides a trigger current (the turn-on current), which subsequently triggers the first parasitic bipolar junction transistor B1 (PNP) and the second parasitic bipolar junction transistor B2 (NPN) to turn on, thereby forming the first parasitic semiconductor controlled rectifier SCR-1. The first parasitic semiconductor controlled rectifier SCR-1 with low holding voltage ($V_{Hold}$) and low resistance (R) may provide a current path from the input/output terminal IO to the ground terminal VSS to discharge electrostatic charges away from the circuit under protection.

When the components under protection in the system are in normal operation (no electrostatic discharge event occurs), the third P-type doped region P3 is switched to be electrically connected to the ground terminal VSS. The base (the first P-type well region PW1)-emitter (the third N-type doped region N3) junction of the second parasitic bipolar junction transistor B2 is not in forward bias condition, thus the second parasitic bipolar junction transistor B2 will not be triggered to ON. Moreover, the first N-type deep well region DNW1 is electrically connected to the power supply terminal VCC, which is the highest voltage level of the whole system. Therefore, the emitter (the first P-type doped region P1)-base (the first N-type deep well region DNW1) junction of the first parasitic bipolar junction transistor B1 is not in forward bias condition, so the first parasitic bipolar junction transistor B1 will not be triggered to ON. Since neither the first parasitic bipolar junction transistor B1 nor the second parasitic bipolar junction transistor B2 is triggered to ON, the first parasitic semiconductor controlled rectifier SCR-1 will not be triggered to ON, and no leakage/latch-up will occur.

Figures 5A, 5B:
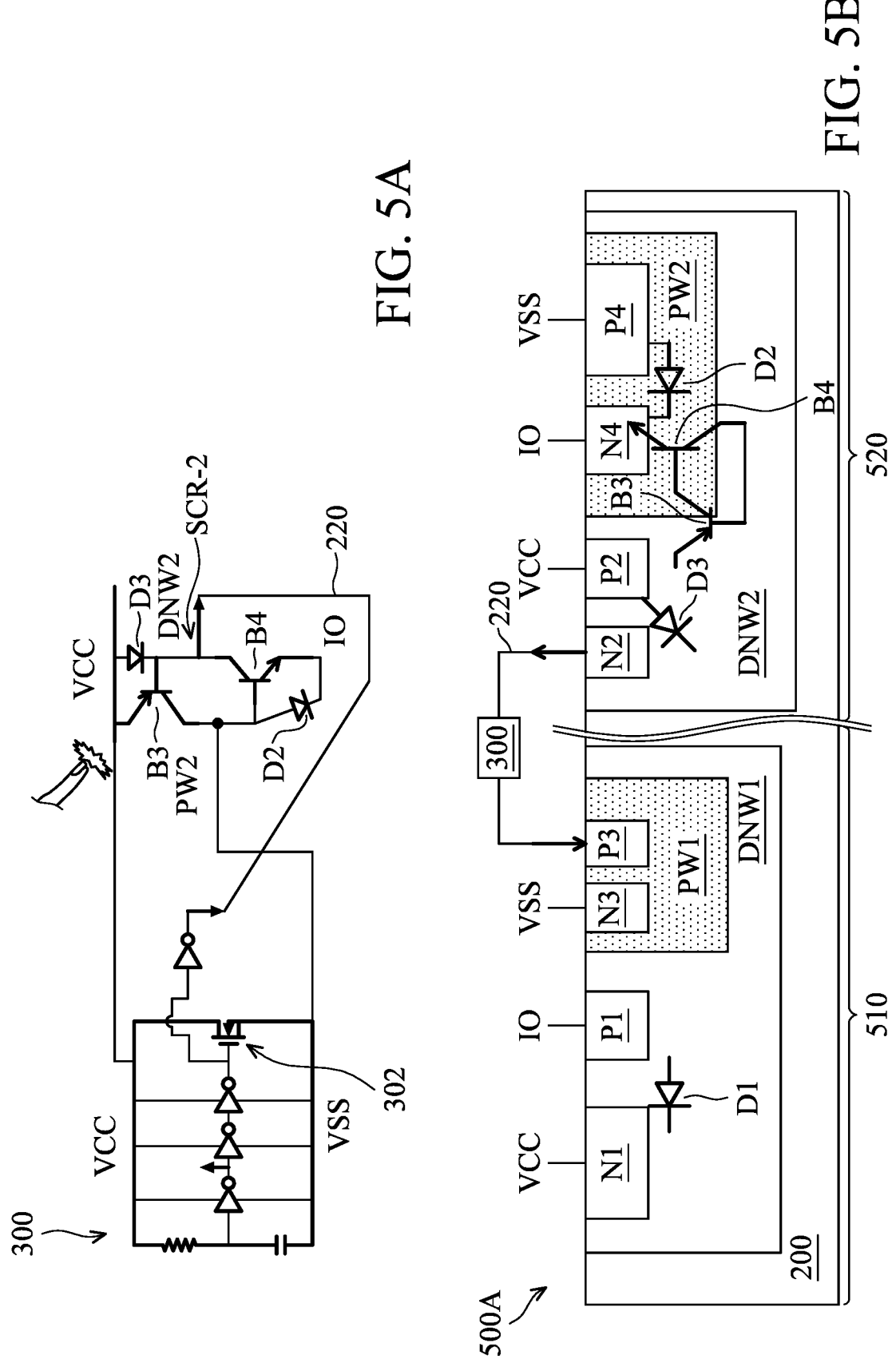
FIG. 5A is an equivalent discharge circuit diagram of the electrostatic discharge protection device when an electrostatic discharge event occurs between the power supply terminal (VCC) and the input/output terminal (IO)
FIG. 5B is a schematic cross-sectional view showing the parasitic elements of the equivalent discharge circuit of FIG. 5A at the corresponding positions of the electrostatic discharge protection device of FIG. 2.

FIG. 5A is an equivalent discharge circuit diagram of the ESD protection device 500A when an electrostatic discharge event occurs between the power supply terminal VCC and the input/output terminal IO. FIG. 5B is a schematic cross-sectional view showing the parasitic elements of the equivalent discharge circuit of FIG. 5A at the corresponding positions of the ESD protection device 500A of FIG. 2. As shown in FIGS. 5A and 5B, in addition to the first parasitic diode D1 and the second parasitic diode D2, the equivalent discharge circuit also includes the third parasitic diode D3 formed by the second P-type doped region P2 and the second N-type deep well region DNW2, and the third parasitic bipolar junction transistor B3 (such as the parasitic PNP BJT) formed by the second P-type doped region P2, the second N-type deep well region DNW2 and the second P-type well region PW2. Emitter, base and collector of the third parasitic bipolar junction transistor B3 are respectively formed by the second P-type doped region P2, the second N-type deep well region DNW2 and the second P-type well region PW2. The equivalent discharge circuit further includes a fourth parasitic bipolar junction transistor B4 (such as a parasitic NPN BJT) formed by a fourth N-type doped region N4, a second P-type well region PW2 and a second N-type deep well region DNW2. Emitter, base and collector of the fourth parasitic bipolar junction transistor B4 are respectively formed by the fourth N-type doped region N4, the second P-type well region PW2 and the second N-type deep well region DNW2. Moreover, the base (the second N-type deep well region DNW2) of the third parasitic bipolar junction transistor B3 is electrically connected to the collector (the second N-type deep well region DNW2) of the fourth parasitic bipolar junction transistor B4, and the base (the second P-type well region PW2) of the fourth parasitic bipolar junction transistor B4 is electrically connected to the collector (the second P-type well region PW2) of the third parasitic bipolar junction transistor B3 to form a second parasitic semiconductor controlled rectifier SCR-2. In addition, the emitter (the second P-type doped region P2) of the third parasitic bipolar junction transistor B3 is electrically connected to the power supply terminal VCC and the anode of the third parasitic diode D3. The base (the second N-type deep well region DNW2) of the third parasitic bipolar junction transistor B3 is electrically connected to the cathode of the third parasitic diode D3. The emitter (the fourth N-type doped region N4) of the fourth parasitic bipolar junction transistor B4 is electrically connected to the input/output terminal IO and the cathode of the second parasitic diode D2. The base (the second P-type well region PW2) of the fourth parasitic bipolar junction transistor B4 is electrically connected to the anode of the second parasitic diode D2.

As shown in FIGS. 5A and 5B, when an electrostatic discharge (ESD) event occurs between the power supply terminal VCC and the input/output terminal IO, the electrostatic discharge current will flow through the switching circuit 300. In addition, the switching circuit 300 will output a low level (low voltage level) to the second N-type doped region N2 (switched to be electrically connected to the ground terminal VSS at this time) by the RC detector to form a current path. The low level is lower than the voltage level of the power supply terminal VCC. Moreover, a current path is formed by the switching circuit 300 which is electrically connected to the base (the second N-type deep well region DNW2) of the third parasitic bipolar junction transistor B3 through the conductive line 220. Therefore, when the low level output by the switching circuit 300 is lower than the voltage level of the power supply terminal VCC, the emitter (the second P-type doped region P2)-base (the second N-type deep well region DNW2) junction of the third parasitic bipolar junction transistor B3 is forward biased, so that the third parasitic bipolar junction transistor B3 is triggered to ON. In addition, the electrostatic discharge current will flow through the switching circuit 300 and form a current path through a RC detector to output a high level to the gate of the N-type metal-oxide-semiconductor transistor (NMOS) 302. The high level is higher than the ground level of the ground terminal VSS, so that the N-type metal-oxide-semiconductor transistor (NMOS) 302 turns on to form a current path flowing to the ground terminal VSS. In addition, the second parasitic diode D2 and the base (the second P-type well region PW2)-emitter (the fourth N-type doped region N4) junction of the fourth parasitic bipolar junction transistor B4 are forward biased, so that the fourth parasitic bipolar junction transistor B4 is triggered to ON. Since the third parasitic bipolar junction transistor B3 and the fourth parasitic bipolar junction transistor B4 are triggered to ON simultaneously, the second parasitic semiconductor controlled rectifier SCR-2 is triggered to ON and form a current path flowing to the input/output terminal IO. The current path provides a trigger current (turn-on current), which subsequently triggers the third parasitic bipolar junction transistor B3 (the PNP BJT) and the fourth parasitic bipolar junction transistor B4 (the NPN BJT) to turn on, thereby forming a second parasitic semiconductor controlled rectifier SCR-2. The second parasitic semiconductor controlled rectifier SCR-2 with low holding voltage ($V_{Hold}$) and low resistance (R) can provide a current path from the power supply terminal VCC to the input/output terminal IO to discharge electrostatic charges away from the circuit under protection.

When the components under protection in the system are in normal operation (no electrostatic discharge event occurs), the second N-type doped region N2 is switched to be electrically connected to the power supply terminal VCC. The emitter (the second P-type doped region P2)-base (the second N-type deep well region DNW2) junction of the third parasitic bipolar junction transistor B3 is not in forward bias condition, so the third parasitic bipolar junction transistor B3 will not be triggered to ON. Moreover, the second P-type well region PW2 is electrically connected to the ground terminal VSS, which is the lowest voltage level of the whole system. Therefore, the base (the second P-type well region PW2)-emitter (the fourth N-type doped region N4) junction of the fourth parasitic bipolar junction transistor B4 is not in forward bias condition, the fourth parasitic bipolar junction transistor B4 will not be triggered to ON. Since neither the third parasitic bipolar junction transistor B3 nor the fourth parasitic bipolar junction transistor B4 is triggered to ON, the second parasitic semiconductor controlled rectifier SCR-2 will not be triggered to ON, and no leakage/latch-up will occur.

FIGS. 6-10 are partial schematic cross-sectional views of the ESD protection devices 500B-500F in accordance with some embodiments of the disclosure corresponding to the regions 510 and 520 in FIG. 2. Compared with the ESD protection device 500A, the ESD protection device 500B shown in FIG. 6 further includes a first gate structure G1 and/or a second gate structure G2, and a sixth P-type doped region P6 and/or a sixth N-type doped region N6. The first gate structure G1 is disposed on the first N-type deep well region DNW1 in the P-type semiconductor substrate 200. In addition, the first gate structure G1 partially overlaps the first P-type doped region P1 and the sixth P-type doped region P6 disposed in the first N-type deep well region DNW1. In some embodiments, the sixth P-type doped region P6 is electrically connected to the power supply terminal VCC. Therefore, the first gate structure G1, the first P-type doped region P1 and the sixth P-type doped region P6 in the first N-type deep well region DNW1 may form a first P-type metal-oxide-semiconductor (PMOS) transistor PM1. In some embodiments, the first P-type doped region P1 of the first PMOS transistor PM1 and the first N-type doped region N1 may form a parasitic diode, which is equivalent to the first parasitic diode D1. The equivalent discharge circuit of left half of FIG. 6 (including the first parasitic diode D1, the first parasitic bipolar junction transistor B1, and the second parasitic bipolar junction transistor B2) may have the same function as the equivalent discharge circuit shown in FIGS. 4A and 4B.

Figure 6:
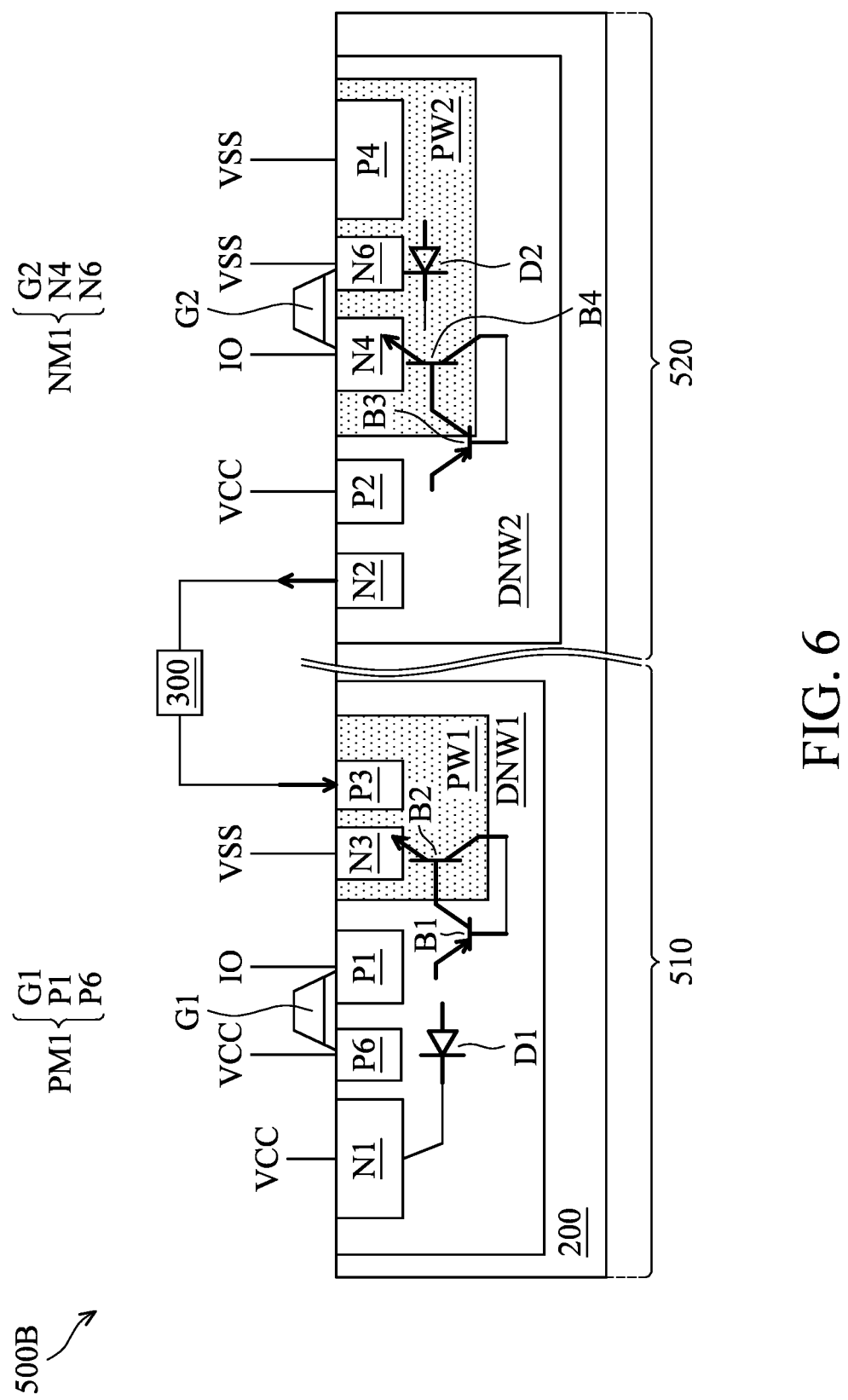
FIGS. 6-10 are partial schematic cross-sectional views of an electrostatic discharge protection device in accordance with some embodiments of the disclosure.

As shown in FIG. 6, the second gate structure G2 is disposed on the second P-type well region PW2 in the P-type semiconductor substrate 200. In addition, the second gate structure G2 partially overlaps the fourth N-type doped region N4 and the sixth N-type doped region N6 in the second P-type deep well region PW2. In some embodiments, the sixth N-type doped region N6 is electrically connected to the ground terminal VSS. Therefore, the second gate structure G2 and the fourth N-type doped region N4 and the sixth N-type doped region N6 in the second P-type well region PW2 may form the first N-type metal-oxide-semiconductor (NMOS) transistor NM1. In some embodiments, the fourth N-type doped region N4 of the first NMOS transistor NM1 and the second P-type well region PW2 may form a parasitic diode, which is equivalent to the second parasitic diode D2. The equivalent discharge circuit of right half of FIG. 6 (including the second parasitic diode D2, the third parasitic bipolar junction transistor B3, and the fourth parasitic bipolar junction transistor B4) may have the same function as the equivalent discharge circuit as shown in FIGS. 5A and 5B.

Figure 7:
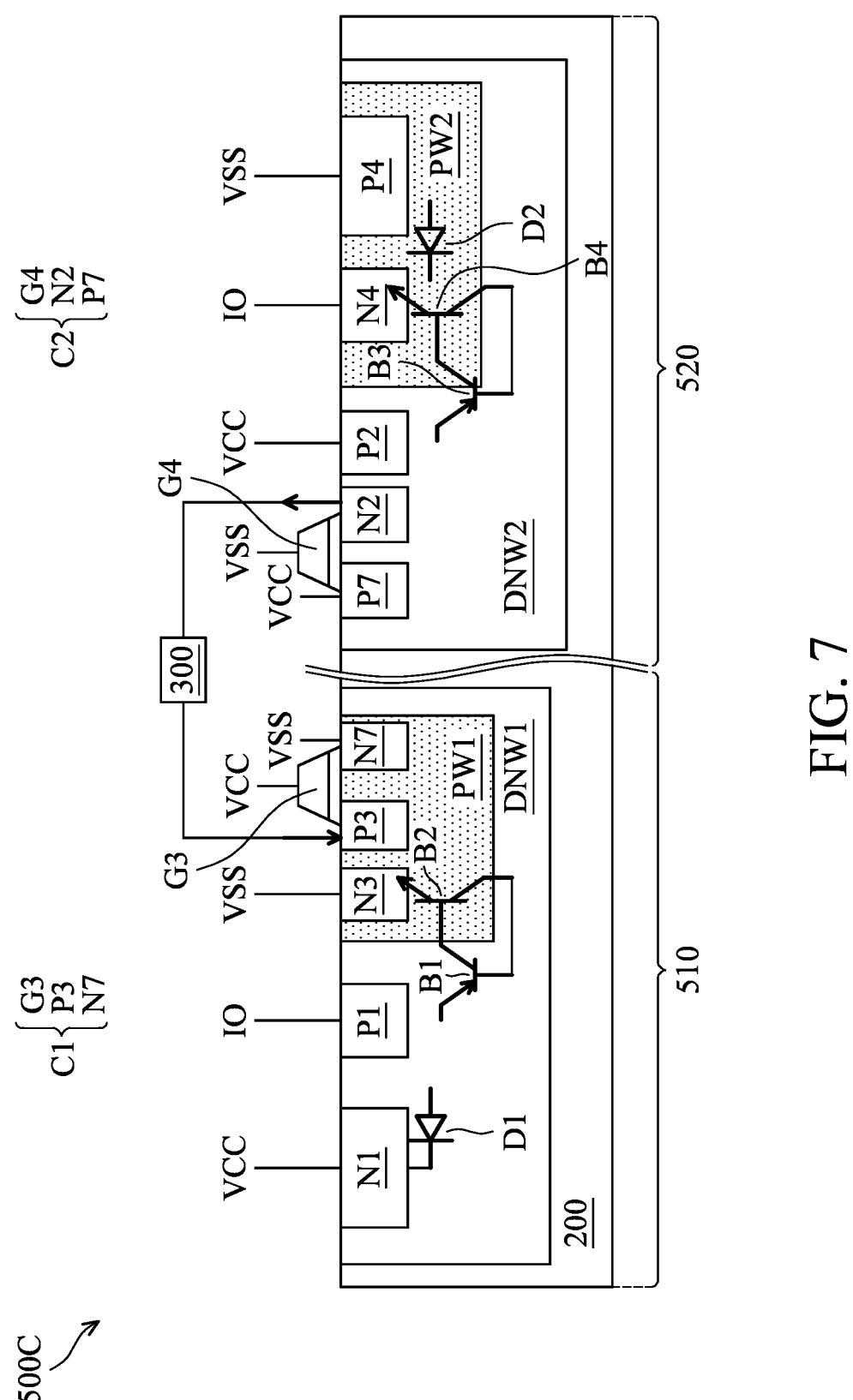

Compared with the ESD protection device 500A, the ESD protection device 500C as shown in FIG. 7 further includes a third gate structure G3 and/or a fourth gate structure G4, and a seventh P-type doped region P7 and/or a seventh N-type doped region N7. The third gate structure G3 is disposed on the first P-type well region PW1 in the P-type semiconductor substrate 200. In addition, the third gate structure G3 partially overlaps the third P-type doped region P3 and the seventh N-type doped region N7 disposed in the first P-type well region PW1. In some embodiments, the third gate structure G3 is electrically connected to the power supply terminal VCC, and the seventh N-type doped region N7 is electrically connected to the ground terminal VSS. Therefore, a first capacitor C1 of the ESD protection device 500C has the function of stabilizing the voltage between the power supply terminal VCC and the ground terminal VSS. In normal operation, the switching circuit 300 outputs a low voltage level (VSS) to the third P-type doped region P3, so the first capacitor C1 still has the function of voltage stabilizing as a general capacitor in this situation. However, when an electrostatic discharge event occurs, the switching circuit 300 will output a high voltage level (VCC) to the third P-type doped region P3 and trigger the second parasitic bipolar junction transistor B2 (the NPN BJT) to turn on. In addition, the triggered second parasitic bipolar junction transistor B2 and the corresponding first parasitic bipolar junction transistor B1 (PNP) forms the first parasitic semiconductor controlled rectifier SCR-1 (FIG. 4A).

As shown in FIG. 7, the fourth gate structure G4 is disposed on the second N-type deep well region DNW2 in the P-type semiconductor substrate 200. In addition, the fourth gate structure G4 partially overlaps the second N-type doped region N2 and in the seventh P-type doped region P7 in the second N-type deep well region DNW2. In some embodiments, the fourth gate structure G4 is electrically connected to the ground terminal VSS, and the seventh P-type doped region P7 is electrically connected to the power supply terminal VCC. Therefore, a second capacitor C2 of the ESD protection device 500C has the function of stabilizing the voltage between the power supply terminal VCC and the ground terminal VSS. In normal operation, the switching circuit 300 outputs a high voltage level (VCC) to the second N-type doped region N2, so the second capacitor C2 still has the function of voltage stabilizing as a general capacitor in this situation. However, when an electrostatic discharge event occurs, the switching circuit 300 will output a low voltage level (VSS) to the second N-type doped region N2 and trigger the third parasitic bipolar junction transistor B3 (PNP) to turn on. In addition, the triggered third parasitic bipolar junction transistor B3 and the corresponding fourth parasitic bipolar junction transistor B4 (NPN) forms the second parasitic semiconductor controlled rectifier SCR-2 (FIG. 5A).

Figure 8:
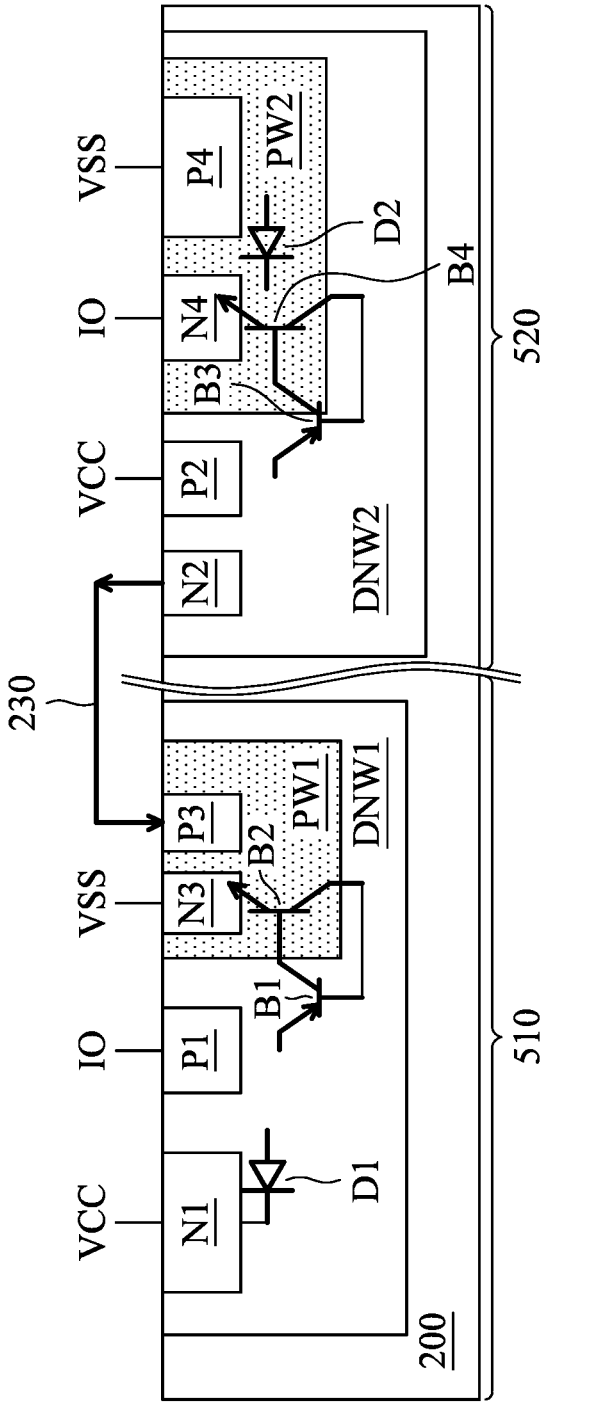
Figure 8:
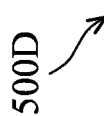

In some embodiments, when the operating voltage of the input/output terminal IO is lower than 1 V, the third P-type doped region P3 and the second N-type doped region N2 can be connected to each other directly by a conductive wire without being electrically connected to the switching circuit 300 (FIG. 2). Compared with the ESD protection device 500A, the ESD protection device 500D as shown in FIG. 8 further includes a conductive line 230. The conductive line 230 is disposed over the P-type semiconductor substrate 200. Moreover, two ends of the conductive line 230 are directly and electrically connected to the third P-type doped region P3 and the second N-type doped region N2 respectively. When the voltage difference between the power supply terminal VCC and the ground terminal VSS is greater than 1.2 V due to the current pulse of the electrostatic discharge event, a current may flow from the second N-type doped region N2 and trigger the emitter (the second P-type doped region P2)-base (the second N-type deep well region DNW2) junction of the third parasitic bipolar junction transistor B3 to turn on. The third P-type doped region P3 will receive the current through the conductive line 230, so that the base (the first P-type well region PW1)-emitter (the third N-type doped region N3) junction of the second parasitic bipolar junction transistor B2 is triggered to ON. The first parasitic semiconductor controlled rectifier SCR-1 and the second parasitic semiconductor controlled rectifier SCR-2 are accordingly triggered to ON to discharge the electrostatic charges away from the circuits under protection.

Figure 9:
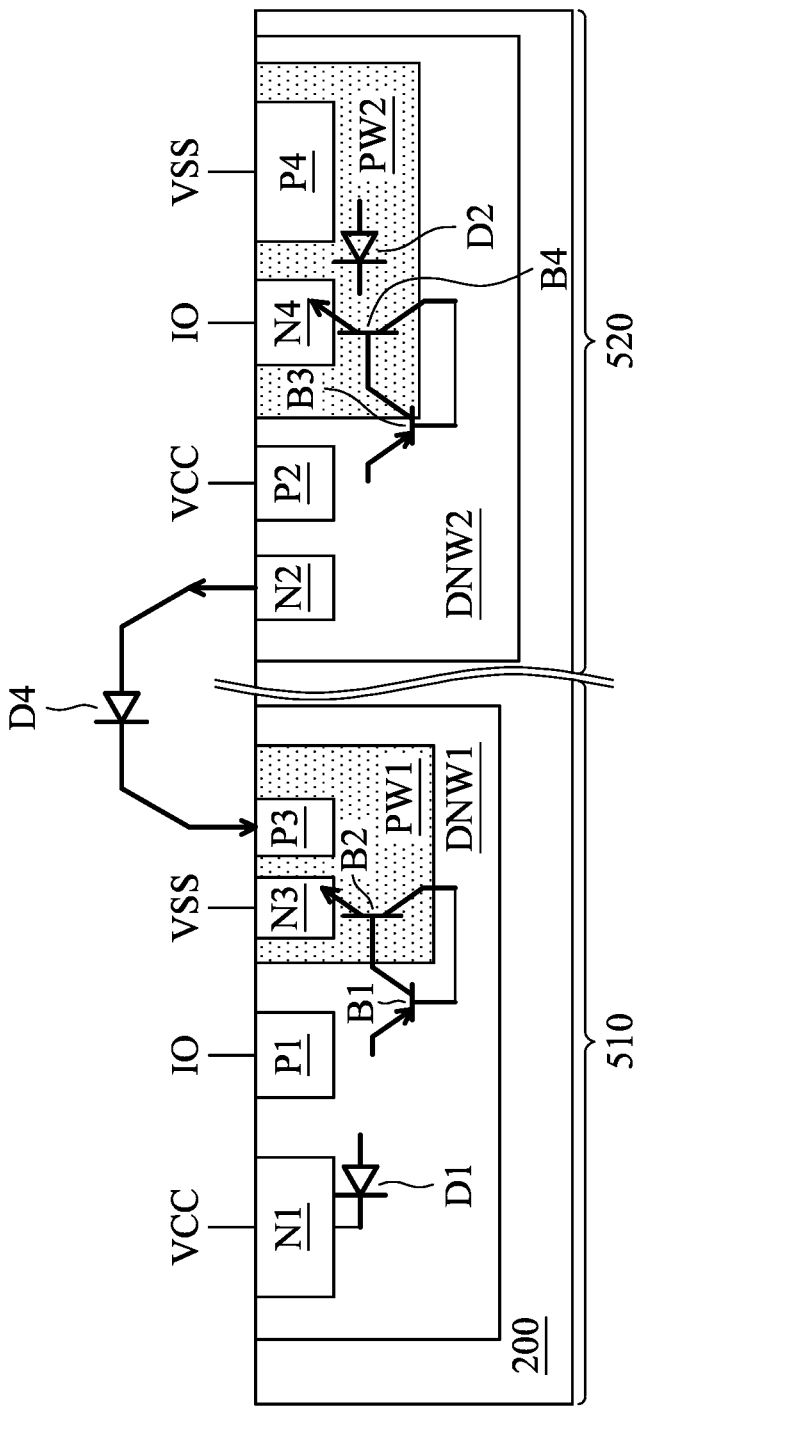

In some embodiments, when the operating voltage of the input/output terminal IO is between 1.0 V and 1.2 V, the third P-type doped region P3 and the second N-type doped region N2 may be connected to each other directly by a diode without being electrically connected to the switching circuit 300 (FIG. 2). Compared with the ESD protection device 500A, the ESD protection device 500E as shown in FIG. 9 further includes a fourth diode D4. The fourth diode D4 is disposed over the P-type semiconductor substrate 200. Moreover, an anode and a cathode of the fourth diode D4 are electrically connected to the second N-type doped region N2 and the third P-type doped region P3, respectively. In some embodiments, when the voltage difference between the power supply terminal VCC and the ground terminal VSS greater than 1.8 V due to the current pulse of the electrostatic discharge event, a current may flow from the second N-type doped region N2 and trigger the emitter (the second P-type doped region P2)-base (the second N-type deep well region DNW2) junction of the third parasitic bipolar junction transistor B3 to turn on. The third P-type doped region P3 will receive the current from the fourth diode D4, so that the base (the first P-type well region PW1)-emitter (the third N-type doped region N3) of the second parasitic bipolar junction transistor B2 is triggered to ON. The first parasitic semiconductor controlled rectifier SCR-1 and the second parasitic semiconductor controlled rectifier SCR-2 are accordingly triggered to ON to discharge the electrostatic charges away from the circuits under protection. In some other embodiments, if the normal operating voltage of the input/output terminal IO is higher than 1.2 V, the third P-type doped region P3 and the second N-type doped region N2 may be connected to each other using a plurality of diodes connected in series connection.

Figure 10:
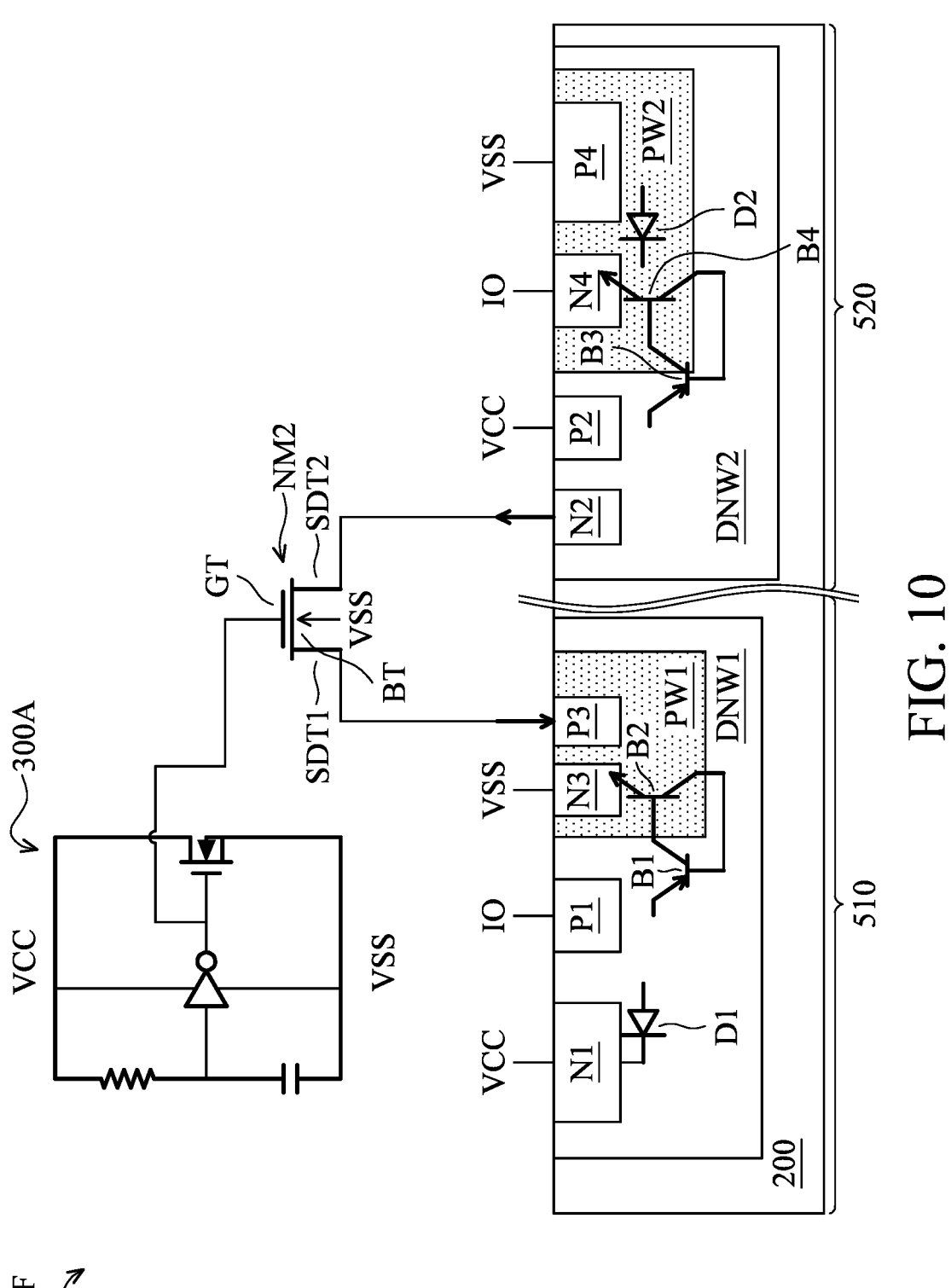

In some embodiments, if the normal operating voltage of the input/output terminal IO is higher than 1.2 V, the third P-type doped region P3 and the second N-type doped region N2 can be connected to each other by an N-type metal-oxide-semiconductor (NMOS) transistor NM2 and a detection circuit without being electrically connected to the switching circuit 300 (FIG. 2). Compared with the ESD protection device 500A, the ESD protection device 500F as shown in FIG. 10 further includes the second NMOS transistor NM2 and a detection circuit 300A composed of a RC detector. The second NMOS transistor NM2 has a base BT, a gate GT, a first source/drain SDT1 and a second source/drain SDT2. In some embodiments, the base BT is electrically connected to the ground terminal VSS, the gate GT is electrically connected to the detection circuit 300A, the first source/drain SDT1 is electrically connected to the third P-type doped region P3, and the second source/drain SDT2 is electrically connected to the second N-type doped region N2. In some embodiments, the detection circuit 300A is composed of a RC detector, which includes a resistor, a capacitor, an inverter, and an NMOS transistor.

When an electrostatic discharge event occurs at the input/output terminal IO, and the ground terminal VSS receives a ground level, the inverter in the detection circuit 300A will output a high level, so that the second NMOS transistor NM2 is turned-on to create the N-type channel (N channel), thereby forming a current path between the second N-type doped region N2 and the third P-type doped region P3. A current may flow from the second N-type doped region N2 and trigger the emitter (the second P-type doped region P2)-base (the second N-type deep well region DNW2) junction of the third parasitic bipolar junction transistor B3 to turn on. The third P-type doped region P3 will receive the current from the second NMOS transistor NM2 so that the base (the first P-type well region PW1)-emitter (the third N-type doped region N3) junction of the second parasitic bipolar junction transistor B2 is triggered to ON. The first parasitic semiconductor controlled rectifier SCR-1 and the second parasitic semiconductor controlled rectifier SCR-2 are accordingly triggered to ON to discharge the electro-static charges away from the circuits under protection.

Embodiments provide an electrostatic discharge (ESD) protection device. The ESD protection device includes func-tional guard ring structures respectively arranged in two N-type deep well regions. The two functional guard ring structures are electrically connected to a functional circuit formed by a RC detector. The ESD protection device can discharge the electrostatic charges away from the circuits under protection when the electrostatic discharge events occurs between any two terminals of the input/output ter-minal IO, the power supply terminal VCC and the ground terminal VSS. When the protected circuit is in normal operation or when an electrostatic discharge (ESD) event occurs, the two functional protection ring structures can be switched to electrically connected to different voltage levels (different levels) by the functional circuit (the switching circuit) according to the situations. When the electrostatic discharge (ESD) event occurs, a parasitic semiconductor controlled rectifier in the functional guard ring structure is triggered to ON to provide an additional discharge path. Moreover, when the protected component is in normal operation, the parasitic semiconductor controlled rectifier in the functional guard ring structure is not easy to be triggered to ON, and has the function of preventing latch-up occur-ring. In some embodiments, the functional circuit (the switching circuit) can be replaced by the conductive lines, diodes, NMOS transistors, and detection circuits composed of RC detectors according to the different normal operating voltage conditions of input/output terminals IO.

While the invention has been described by way of example and in terms of the preferred embodiments, it should be understood that the invention is not limited to the disclosed embodiments. On the contrary, it is intended to cover various modifications and similar arrangements (as would be apparent to those skilled in the art). Therefore, the scope of the appended claims should be accorded the broadest interpretation so as to encompass all such modifi-cations and similar arrangements.

What is claimed is:

1. An electrostatic discharge protection device, compris-ing:
a P-type semiconductor substrate;
a first N-type deep well region located in the P-type semiconductor substrate;
a first N-type doped region located in the first N-type deep well region;
first P-type doped regions located in the first N-type deep well region, wherein the first P-type doped regions and the first N-type doped region are arranged side-by-side and spaced apart from each other;
a second N-type deep well region located in the P-type semiconductor substrate, wherein the second N-type deep well region and the first N-type deep well region are arranged side-by-side and spaced apart from each other;

second N-type doped regions located in the second N-type deep well region;
second P-type doped regions located in the second N-type deep well region, wherein the second P-type doped regions and the second N-type doped regions are arranged side-by-side and spaced apart from each other;
a first P-type well region located in the first N-type deep well region;
third N-type doped regions located in the first P-type well region;
third P-type doped regions located in the first P-type well region, wherein the third P-type doped regions and the third N-type doped regions are arranged side-by-side and spaced apart from each other;
a second P-type well region located in the second N-type deep well region;
fourth N-type doped regions located in the second P-type well region; and
a fourth P-type doped region located in the second P-type well region, wherein the fourth P-type doped region and the fourth N-type doped regions are arranged side-by-side and spaced apart from each other;
wherein the first P-type well region, the first N-type doped region and the first P-type doped regions disposed in the first N-type deep well region, and the third N-type doped regions and the third P-type doped regions disposed in the first P-type well region are arranged symmetrically along an axis passing through a center of the first N-type doped region along an extending direc-tion of the first N-type doped region,
wherein the first P-type doped regions and the fourth N-type doped regions are electrically connected to an input/output terminal,
wherein the first N-type doped region and the second P-type doped regions are electrically connected to a power supply terminal, and
wherein the third N-type doped regions and the fourth P-type doped region are electrically connected to a ground terminal.

2. The electrostatic discharge protection device as claimed in claim 1, further comprising:
a first guard ring located in the P-type semiconductor substrate and surrounding the first N-type deep well region and the second N-type deep well region, wherein the first guard ring comprises:
a third P-well region; and
a fifth P-type doped region located in the third P-type well region; and
a second guard ring located in the P-type semiconductor substrate and surrounding the first guard ring, wherein the second guard ring comprises:
a first N-type well region; and
a fifth N-type doped region located in the first N-type well region.

3. The electrostatic discharge protection device as claimed in claim 2, wherein the fifth P-type doped region is electri-cally connected to the ground terminal.

4. The electrostatic discharge protection device as claimed in claim 2, wherein the fifth N-type doped region is elec-trically connected to the power supply terminal.

5. The electrostatic discharge protection device as claimed in claim 1, wherein the third P-type doped regions and the second N-type doped regions are electrically connected to a switching circuit.

6. The electrostatic discharge protection device as claimed in claim 5, wherein when an electrostatic discharge event occurs at the input/output terminal, the power supply terminal or the ground terminal, the third P-type doped regions are electrically connected to the power supply terminal, and the second N-type doped region is electrically connected to the ground terminal.

7. The electrostatic discharge protection device as claimed in claim 6, wherein each of the first P-type doped regions, the first N-type deep well region and the first N-type doped region form a first parasitic diode, and wherein the fourth P-type doped region, the second P-type well region and each of the fourth N-type doped regions form a second parasitic diode.

8. The electrostatic discharge protection device as claimed in claim 7, wherein when an electrostatic discharge event occurs between the input/output terminal and the power supply terminal, the first parasitic diode is triggered to ON.

9. The electrostatic discharge protection device as claimed in claim 7, wherein when an electrostatic discharge event occurs between the ground terminal and the input/output terminal, the second parasitic diode is triggered to ON.

10. The electrostatic discharge protection device as claimed in claim 7, wherein:
    each of the first P-type doped regions, the first N-type deep well region and the first P-type well region form a first parasitic bipolar junction transistor,
    each of the third N-type doped regions, the first P-type well region and the first N-type deep well region form a second parasitic bipolar junction transistor,
    a base of the first parasitic bipolar junction transistor is electrically connected to a collector of the second parasitic bipolar junction transistor, and a base of the second parasitic bipolar junction transistor is electrically connected to a collector of the first parasitic bipolar junction transistor to form a first parasitic semiconductor controlled rectifier,
    an emitter of the first parasitic bipolar junction transistor is electrically connected to the input/output terminal and an anode of the first parasitic diode,
    the base of the first parasitic bipolar junction transistor is electrically connected to a cathode of the first parasitic diode, and
    an emitter of the second parasitic bipolar junction transistor is electrically connected to the ground terminal.

11. The electrostatic discharge protection device as claimed in claim 7, wherein:
    each of the second P-type doped regions and the second N-type deep well region form a third parasitic diode,
    each of the second P-type doped regions, the second N-type deep well region and the second P-type well region form a third parasitic bipolar junction transistor,
    each of the fourth N-type doped regions, the second P-type well region and the second N-type deep well region form a fourth parasitic bipolar junction transistor,
    a base of the third parasitic bipolar junction transistor is electrically connected to a collector of the fourth parasitic bipolar junction transistor, and a base of the fourth parasitic bipolar junction transistor is electrically connected to a collector of the third parasitic bipolar junction transistor to form a second parasitic semiconductor controlled rectifier,
    an emitter of the third parasitic bipolar junction transistor is electrically connected to the power supply terminal and an anode of the third parasitic diode,
    the base of the third parasitic bipolar junction transistor is electrically connected to a cathode of the third parasitic diode, an emitter of the fourth parasitic bipolar junction transistor is electrically connected to the input/output terminal and a cathode of the second parasitic diode, and
the base of the fourth parasitic bipolar junction transistor is electrically connected to an anode of the second parasitic diode.

12. The electrostatic discharge protection device as claimed in claim 1, further comprising:
    a first gate structure disposed on the first N-type deep well region in the P-type semiconductor substrate, partially overlapping one of the first P-type doped regions and a sixth P-type doped region disposed in the first N-type deep well region, wherein the sixth P-type doped region is electrically connected to the power supply terminal, wherein the first gate structure, the one of the first P-type doped regions and the sixth P-type doped region form a first P-type metal-oxide-semiconductor transistor.

13. The electrostatic discharge protection device as claimed in claim 1, further comprising:
    a second gate structure disposed on the second P-type well region in the P-type semiconductor substrate, partially overlapping one of the fourth N-type doped regions and a sixth N-type doped region disposed in the second P-type deep well region, wherein the sixth N-type doped region is electrically connected to the ground terminal, wherein the second gate structure, the one of the fourth N-type doped regions and the sixth N-type doped region form a first N-type metal-oxide-semiconductor transistor.

14. The electrostatic discharge protection device as claimed in claim 1, further comprising:
    a third gate structure disposed on the first P-type well region in the P-type semiconductor substrate, partially overlapping one of the third P-type doped regions and a seventh N-type doped region disposed in the first P-type well region, wherein the third gate structure is electrically connected to the power supply terminal, and the seventh N-type doped region is electrically connected to the ground terminal, wherein the third gate structure, the one of the third P-type doped regions and the seventh N-type doped region form a first capacitor.

15. The electrostatic discharge protection device as claimed in claim 1, further comprising:
    a fourth gate structure disposed on the second N-type deep well region in the P-type semiconductor substrate, partially overlapping one of the second N-type doped regions and a seventh P-type doped region disposed in the second N-type deep well region, wherein the fourth gate structure is electrically connected to the ground terminal, and the seventh P-type doped region is electrically connected to the power supply terminal, wherein the fourth gate structure, the one of the second N-type doped regions and the seventh P-type doped region form a second capacitor.

16. The electrostatic discharge protection device as claimed in claim 1, further comprising:
    a conductive line disposed over the P-type semiconductor substrate, wherein two ends of the conductive line are directly and electrically connected to one of the third P-type doped regions and one of the second N-type doped regions, respectively.

17. The electrostatic discharge protection device as claimed in claim 1, further comprising:
    a fourth diode disposed over the P-type semiconductor substrate, wherein an anode and a cathode of the fourth diode are electrically connected to one of the second N-type doped regions and one of the third P-type doped regions, respectively.

18. The electrostatic discharge protection device as claimed in claim 1, further comprising:

a second N-type metal-oxide-semiconductor transistor having a base, a gate, a first source/drain and a second source/drain; and a detection circuit, wherein the base is electrically connected to the ground terminal, wherein the gate is electrically connected to the detection circuit, the first source/drain is electrically connected to one of the third P-type doped regions, and the second source/drain is electrically connected to one of the second N-type doped regions.

* * * * *